United States Patent
You

(10) Patent No.: US 12,014,764 B2
(45) Date of Patent: Jun. 18, 2024

(54) MEMORY DEVICE INCLUDING ROW HAMMER PREVENTING CIRCUITRY AND AN OPERATING METHOD OF THE MEMORY DEVICE

(71) Applicant: SAMSUNG ELECTRONICS CO., LTD., Suwon-si (KR)

(72) Inventor: Jungmin You, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 108 days.

(21) Appl. No.: 17/939,327

(22) Filed: Sep. 7, 2022

(65) Prior Publication Data

US 2023/0079457 A1  Mar. 16, 2023

(30) Foreign Application Priority Data

Sep. 10, 2021 (KR) .................. 10-2021-0121181

(51) Int. Cl.
*G11C 11/406* (2006.01)
*G11C 11/4078* (2006.01)

(52) U.S. Cl.
CPC .. *G11C 11/40618* (2013.01); *G11C 11/40615* (2013.01); *G11C 11/4078* (2013.01)

(58) Field of Classification Search
CPC ........ G11C 11/40618; G11C 11/40615; G11C 11/4078; G11C 11/40611; G11C 11/40622; G11C 11/408; G11C 7/24
USPC .............................................. 365/222, 230.06
See application file for complete search history.

(56) References Cited

U.S. PATENT DOCUMENTS

| | | |
|---|---|---|
| 9,536,586 B2 | 1/2017 | Sohn et al. |
| 9,645,904 B2 | 5/2017 | Fee et al. |
| 9,747,971 B2 | 8/2017 | Bains et al. |
| 10,262,717 B2 | 4/2019 | Fisch et al. |
| 10,446,216 B2 | 10/2019 | Oh et al. |
| 10,636,476 B2 | 4/2020 | Nale |

(Continued)

FOREIGN PATENT DOCUMENTS

| | | | | |
|---|---|---|---|---|
| CN | 114464223 A | * | 5/2022 | ....... G11C 11/40611 |
| CN | 114649044 A | * | 6/2022 | ............. G11C 29/08 |

OTHER PUBLICATIONS

Kim et al., "Flipping Bits in Memory Without Accessing Them: An Experimental Study of DRAM Disturbance Errors", 2014, IEEE, pp. 1-12.

*Primary Examiner* — Michael T Tran
(74) *Attorney, Agent, or Firm* — F. Chau & Associates, LLC

(57) ABSTRACT

A row hammer preventing circuitry including: a first table storing a count value representing a hit count and an address bit of multiple entries, each entry corresponding to access-requested target rows; a second table including safe bits and a safe bit counter; and a row hammer preventing logic to identify masking entries, on which a masking comparison is to be performed, among the entries on the basis of the safe bit counter, to determine a hit or miss on the basis of whether other bits except an MSB among address bits of an access-requested target row match other bits except an MSB among address bits of the masking entries, and to generate a control signal indicating an additional refresh on rows adjacent to rows corresponding to a masking entry whose hit count is greater than a threshold value.

20 Claims, 7 Drawing Sheets

(56) References Cited

U.S. PATENT DOCUMENTS

| | | | |
|---|---|---|---|
| 10,790,005 B1 | 9/2020 | He et al. | |
| 2020/0176047 A1* | 6/2020 | Meier | G11C 11/40626 |
| 2021/0013213 A1* | 1/2021 | Kim | H10B 12/30 |
| 2021/0398584 A1* | 12/2021 | Devaux | G11C 29/783 |
| 2022/0068363 A1* | 3/2022 | Lee | G11C 11/40626 |
| 2022/0138318 A1* | 5/2022 | Xu | G06F 21/554 |
| | | | 726/22 |
| 2022/0270661 A1* | 8/2022 | Cho | G11C 11/406 |
| 2023/0154521 A1* | 5/2023 | Kim | G11C 11/4072 |
| | | | 365/222 |
| 2023/0162777 A1* | 5/2023 | Chen | G11C 11/4085 |
| | | | 365/222 |
| 2023/0393748 A1* | 12/2023 | Lu | G06F 3/0659 |

* cited by examiner

FIG. 3C

| Row Addr | Cnt |
|---|---|
| 0xX010 | 25 |
| 0x0110 | 33 |
| 0x1100 | 16 |
|  |  |

| Row Addr | Cnt |
|---|---|
| 0xX010 | 26 |
| 0x0110 | 33 |
| 0x1100 | 16 |
|  |  |

TABLE

TIMELINE — T5 — T6

MEMORY DEVICE INCLUDING ROW HAMMER PREVENTING CIRCUITRY AND AN OPERATING METHOD OF THE MEMORY DEVICE

CROSS-REFERENCE TO RELATED APPLICATION

This application claims priority under 35 U.S.C. § 119 to Korean Patent Application No. 10-2021-0121181, filed on Sep. 10, 2021, in the Korean Intellectual Property Office, the disclosure of which is incorporated by reference herein in its entirety.

TECHNICAL FIELD

The inventive concept relates to a memory device, and more particularly, to a memory device including row hammer preventing circuitry for preventing a row hammer and an operating method of the memory device.

DISCUSSION OF RELATED ART

As computer systems continue to become more ubiquitous, hacking, which is the activity of identifying a weakness in a computer system or a network to exploit the security to illegally gain access to personal data or business data, is advancing.

Volatile memory devices such as dynamic random access memory (DRAM) may periodically perform a refresh operation to maintain stored data. As memory devices continue to shrink, an interval between word lines decreases, and thus, an adverse influence of a voltage distribution of one word line on an electric charge of a memory cell connected to an adjacent word line may occur. Therefore, when one word line is intensively accessed, since a voltage having an activation state is repeatedly applied to the one word line, bit-flip or row hammer may occur. Bit flip refers to when pieces of data stored in memory cells connected to an adjacent word line are inverted and row hammer refers to when the pieces of data stored in the memory cells are lost. Accordingly, there is a need to prevent such phenomenon from occurring.

SUMMARY

The inventive concept provides a memory device for decreasing row hammering.

According to an embodiment of the inventive concept, there is provided a row hammer preventing circuitry including: a first table configured to store a count value representing a hit count and an address bit of each of a plurality of entries, each of the entries corresponding to access-requested target rows; a second table including safe bits representing whether each of the plurality of entries is accessed twice or more and a safe bit counter representing the number of the safe bits having a logic low; and a row hammer preventing logic configured to identify masking entries, on which a masking comparison is to be performed, among the plurality of entries stored in the first table on the basis of a value of the safe bit counter, to determine a hit or a miss on the basis of whether other bits except a most significant bit among address bits of an access-requested target row match other bits except a most significant bit among address bits of the masking entries, and to generate a first control signal indicating an additional refresh is to be performed on rows adjacent to rows corresponding to a masking entry whose hit count is greater than a first threshold value.

According to an embodiment of the inventive concept, there is provided a memory device including: a memory cell array including a plurality of row memories; and a memory controller including a table, which includes a count value representing a hit count and address bits of a plurality of entries, a safe bit representing whether each of a plurality of target rows is accessed twice or more during a refresh interval, and a safe bit counter representing the number of the safe bits having a logic low: and a row hammer preventing circuitry configured to identify masking entries, on which a masking comparison is to be performed, among a plurality of entries stored in the table on the basis of a value of the safe bit counter and to determine a hit or a miss on the basis of whether other bits except a most significant bit among address bits of an access-requested target row match other bits except a most significant bit among address bits of the masking entries.

According to an embodiment of the inventive concept, there is provided an operating method of a memory device, the operating method including: receiving an access command corresponding to a target row; identifying a masking entry among a plurality of entries corresponding to access-requested rows; performing a first comparison in which it is determined whether other bits except a most significant bit in address bits of the masking entry matches other bits except a most significant bit in address bits of the target row; when a hit occurs as a result of the first comparison, increasing a hit count of a masking entry corresponding to the hit; and when the hit count is greater than a threshold value, generating a control signal indicating an additional refresh is to be performed on rows respectively adjacent to two rows corresponding to the masking entry.

BRIEF DESCRIPTION OF THE DRAWINGS

Embodiments of the inventive concept will be more clearly understood from the following detailed description taken in conjunction with the accompanying drawings in which:

FIG. 3C illustrates a data change of a first table according to embodiments of the inventive concept;

DETAILED DESCRIPTION OF THE EMBODIMENTS

Hereinafter, embodiments of the inventive concept will be described in detail with reference to the accompanying drawings.

Figure 1:
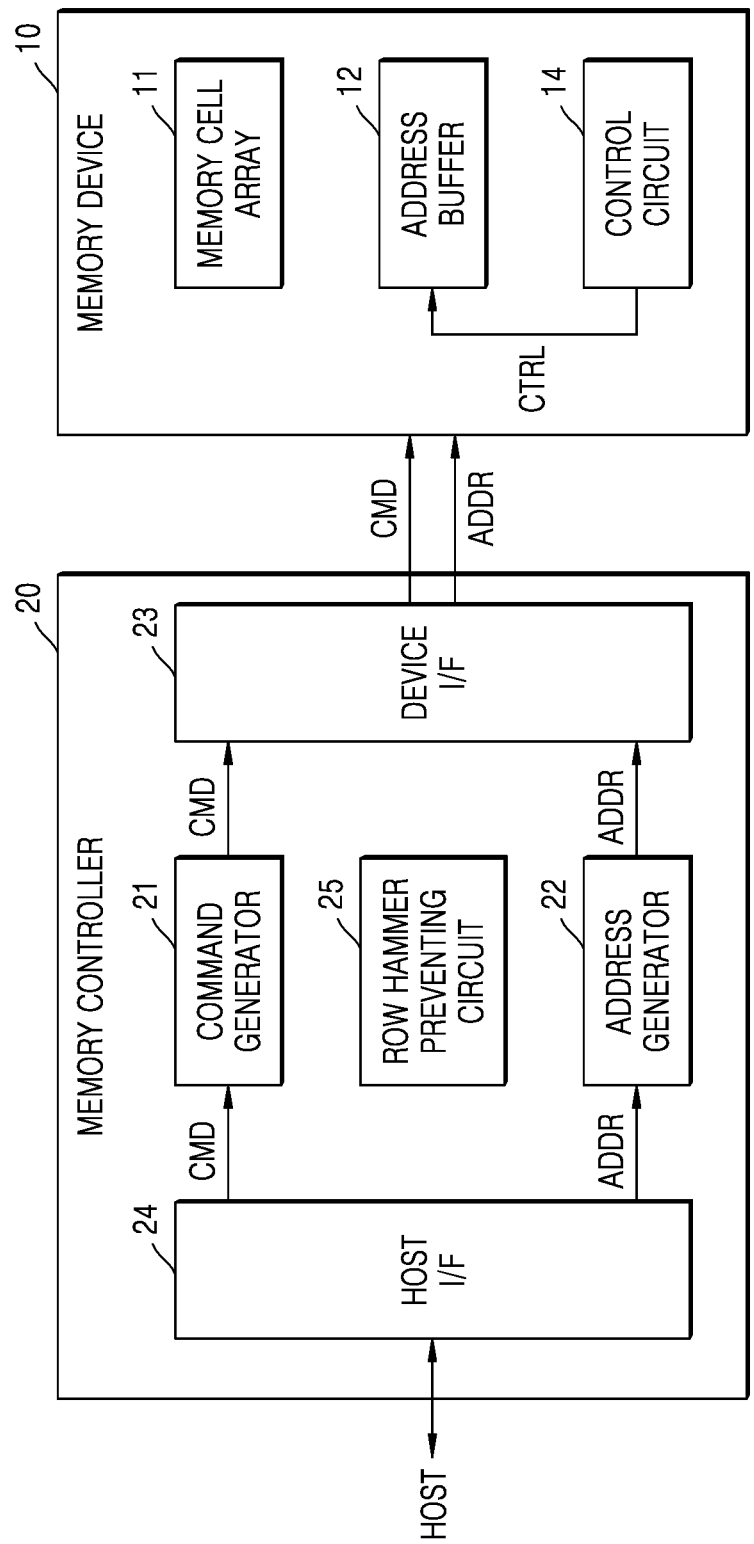
FIG. 1 is a block diagram illustrating a schematic configuration of a memory system according to an embodiment of the inventive concept.

FIG. 1 is a block diagram illustrating a schematic configuration of a memory system according to an embodiment of the inventive concept.

Referring to FIG. 1, the memory system may include a memory device 10 and a memory controller 20.

According to various embodiments, the memory controller 20 may transmit and receive data to and from a host device HOST and may transmit a command CMD and an address ADDR to the memory device 10. The memory controller 20 may include a command generator 21, an address generator 22, a device interface 23, and a host interface 24. The memory controller 20 may further include row hammer prevention circuitry 25. The row hammer prevention circuitry 25 may also be referred to as a row hammer prevention circuit.

According to various embodiments, the host interface 24 may receive the command CMD and the address ADDR from the host device HOST, and the command generator 21 may decode the command CMD received from the host device HOST to generate an access command. The device interface 23 may transfer the access command, generated based on the decoding, to the memory device 10. The access command may be a signal indicating that the memory device 10 accesses a row of a memory cell array 11 corresponding to the address ADDR to read or write data.

According to various embodiments, the address generator 22 may decode the address ADDR received from the host interface 24 to generate a row address and a column address, which are to be accessed, of the memory cell array 11. Furthermore, when the memory cell array 11 includes a plurality of banks, the memory device 10 may generate an address of a bank which is to be accessed.

The row hammer preventing circuitry 25 may generate a row hammer refresh command and may provide the row hammer refresh command to the memory device 10 through the device interface 23. The row hammer refresh command may be a signal indicating performing of an additional refresh operation on word lines adjacent to word lines which are intensively accessed for a short time. In other words, the row hammer refresh command instructs the memory device 10 to perform an additional refresh operation word lines adjacent to word lines that were intensively accessed in a short amount of time.

The memory controller 20 may provide various control signals to the memory device 10 through the device interface 23 to control a memory operation such as a write operation or a read operation. For example, the memory controller 20 may provide a read command or a write command to the memory device 10. In addition, the memory controller 20 may provide a precharge command to the memory device 10. The precharge command may be a command for changing a state of the memory cell array 11 from an active state to a standby state after a write operation or a read operation is completed.

According to an embodiment, in a case where an access command is provided to the memory device 10, the memory controller 20 may transfer the access command and an address ADDR of a row, which is to be accessed, to the memory device 10. In a case where the row hammer refresh command is provided to the memory device 10, the memory controller 20 may transfer the row hammer refresh command and addresses of target rows, which are intensively accessed, to the memory device 10. When the memory device 10 receives the row hammer refresh command and the addresses of the target rows, the memory device 10 may perform an additional refresh operation on adjacent word lines of a word line corresponding to a target row. In other words, an additional refresh operation may be performed on the word lines immediately above and immediately below the word line corresponding to the target row.

The memory device 10 may be a storage device based on a semiconductor device and may include the memory cell array 11, an address buffer 12, and a control circuit 14.

According to an embodiment, the memory device 10 may be a random access memory (RAM) device such as dynamic RAM (DRAM), synchronous RAM (SRAM), double data rate SDRAM (DDR SDRAM), DDR2 SDRAM, DDR3 SDRAM, phase-change RAM (PRAM), magnetic RAM (MRAM), or resistive RAM (RRAM). In addition, the memory device 10 may be any memory device 10 requiring a refresh operation. For example, in a case where the resistive memory device 10 is a non-volatile memory and performs a refresh operation, the memory device 10 may be a non-volatile memory device 10. In response to an address ADDR and a command CMD each received from the memory controller 20, the memory device 10 may receive or output data through data lines and may perform a refresh operation.

The memory cell array 11 may include a plurality of memory cells, and the plurality of memory cells may be connected to word lines and bit lines. Based on the address ADDR and the command CMD each received from the memory controller 20, the control circuit 14 may write data in the memory cell array 11, read data from the memory cell array 11, or provide a row decoder and a column decoder with a control signal CTRL for refreshing memory cells included in the memory cell array 11. Therefore, the control circuit 14 may perform an overall operation for processing data of the memory cell array 11.

The memory device 10 may perform a normal refresh operation on at least some of memory cells of the memory cell array 11 on the basis of a normal refresh command. For example, in a case where the memory device 10 performs the normal refresh operation, the memory device 10 may sequentially refresh memory cell rows of the memory cell array 11. The memory device 10 may perform a refresh operation on at least some of the memory cells of the memory cell array 11 on the basis of the row hammer refresh command. For example, when the memory device 10 performs the refresh operation on the basis of the row hammer refresh command, the memory device 10 may perform the refresh operation on adjacent word lines of a word line corresponding to a target row.

Figure 2:
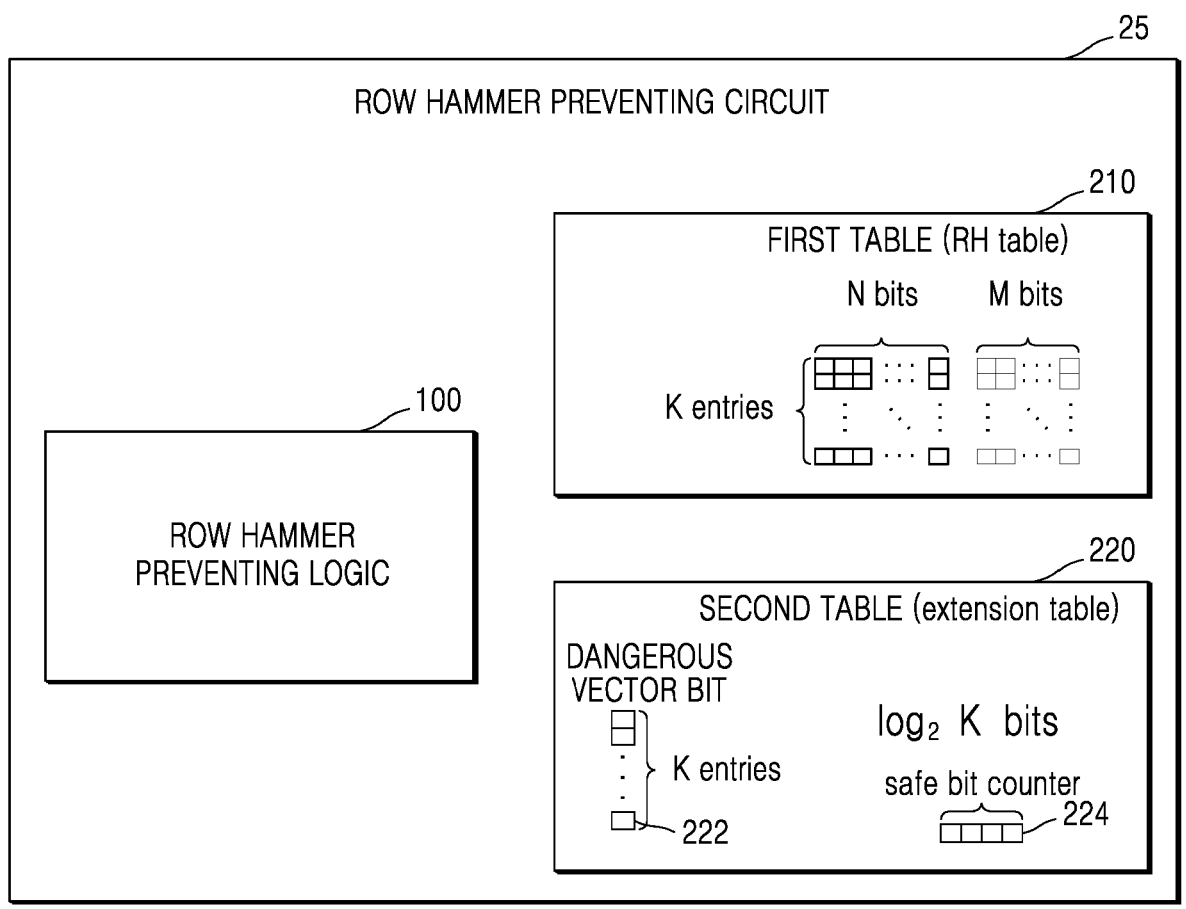
FIG. 2 is a block diagram of row hammer preventing circuitry according to embodiments of the inventive concept.

FIG. 2 is a block diagram of row hammer preventing circuitry 25 according to embodiments of the inventive concept.

Referring to FIG. 2, the row hammer preventing circuitry 25 may include a row hammer preventing logic 100, a first table 210, and a second table 220.

The first table 210 may store a counter value representing address bits and the number of accessed address bits. The first table 210 according to an embodiment may store bits having a predefined size. An address bit string may correspond to an M bit. The M bit may correspond to a maximum integer for expressing an address. For example, when the maximum address is 1023, M may correspond to 10. The counter bit may correspond to an N bit. The counter bit may have a value representing the number of accesses to a row address corresponding to the address bit string. The N bit may be determined based on a maximum value of the number of accesses to an address which is to be measured. For example, when the number of accesses to a memory address is a maximum of 500, N may correspond to 9. One row address bit and a counter bit corresponding thereto may be referred to as one entry. The first table 210 may include a plurality of entries. In other words, the first table 210 may store a plurality of addresses for managing a target row on which row hammering is to be performed. Each row may include M+N bits of a counter bit and an address bit, and thus, when the first table 210 manages K number of rows, the first table 210 may store K*(M+N) bits.

The second table 220 may store a dangerous vector bit row 222 and a safe bit counter 224. When K number of entries are stored in the first table 210, the safe bit counter 224 may include $\log_2 K$ number of registers. The dangerous vector bit row 222 may include safe bits where one bit is allocated to each entry of the first table 210. The dangerous vector bit row 222 may correspond to the same bit as the number of entries. For example, in a case where the first table 210 manages K number of rows, a safe bit may be a K bit. The safe bit may be a bit representing that each entry is accessed twice or more. For example, when an address stored in a first entry of the first table 210 is accessed twice or more, a first safe bit of the dangerous vector bit row 222 may have a logic high value or a value "1". As another example, when an address stored in a second entry of the first table 210 is accessed only once, a second safe bit of the dangerous vector bit row 222 may have a logic low value or a value "0".

The safe bit counter 224 may represent the number of bits having a logic low value or a value "0" among safe bits included in the dangerous vector bit row 222. According to various embodiments, a size of the dangerous vector bit row 222 and the number of safe bit counters 224 may be determined based on the number of entries managed by the first table 210. For example, when the first table 210 stores K number of entries, the dangerous vector bit row 222 may include K number of safe bits. The safe bit counter 224 may include registers which store the $\log_2 K$ bits.

According to various embodiments, the safe bit counter 224 may be updated whenever a refresh interval ends. A value of the dangerous vector bit row 222 may be changed by an access based on row hammering during a previous refresh interval. At a time at which the previous refresh interval ends, the safe bit counter 224 may identify the number of bits of "0" or logic low among bits of the dangerous vector bit row 222. A value of the safe bit counter 224 may be a criterion which variably determines whether to perform bit masking on some of a plurality of entries included in the first table 210, when a next refresh interval starts. A detailed description of bit masking will be described below.

The row hammer preventing logic 100 may generate the row hammer refresh command with reference to the first table 210 and the second table 220. According to an embodiment, the row hammer preventing logic 100 may receive an access command and row address information to update the first table 210. The row hammer preventing logic 100 may determine whether an access-requested row address is included in the first table 210. Hereinafter, an access-requested row address may be referred to as a target row address. In other words, the row hammer preventing logic 100 may determine whether the target row address is included in the first table 210.

When the target row address is the same as one of the entries of the first table 210, the row hammer preventing logic 100 may increase, by one, a counter value corresponding to the entry having the same address bit as the target row address.

When the target row address differs from all of address bits of the entries of the first table 210, the row hammer preventing logic 100 may update the target row address as a new entry in the first table 210.

According to an embodiment, when the entries of the first table 210 is fully filled, the row hammer preventing logic 100 may delete one entry among the entries of the first table 210 and may newly write the target row address. In other words, when the first table 210 is full, the row hammer preventing logic 100 may delete on of the entries to make space for a new entry. The row hammer preventing logic 100 may delete an entry having a smallest counter value from among the entries of the first table 210, but the inventive concept is not limited thereto. A criterion for deleting one entry from among the entries of the first table 210 by using the row hammer preventing logic 100 may be variously set. For example, the row hammer preventing logic 100 may delete an entry, which is lately written, from among the entries of the first table 210 and may newly write the target row address.

According to an embodiment, when an entry having a greater counter value than a predetermined threshold value occurs, the row hammer preventing logic 100 may transfer a row hammer refresh command and a row address bit of a corresponding entry to the memory device 10. The memory device 10 may receive the row hammer refresh command and may identify the target row address on the basis of the row address bit received together therewith. The memory device 10 may perform an additional refresh on adjacent rows of the identified target row address.

Figure 3A:
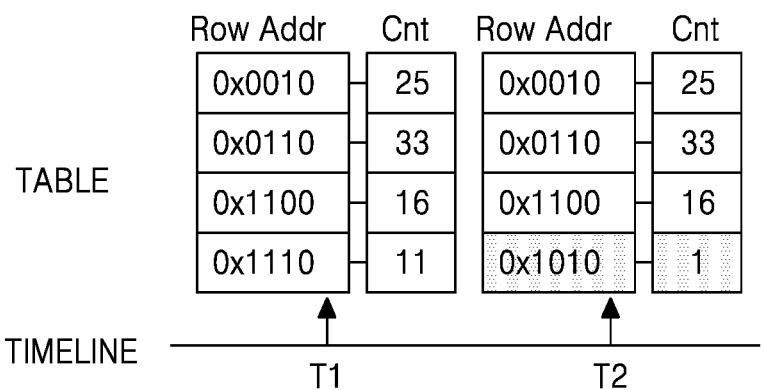
FIG. 3A illustrates a data change of a first table according to a comparative example.

FIG. 3A illustrates a data change of the first table 210 according to a comparative example.

Referring to FIG. 3A, entries stored in the first table 210 at a time T1 are illustrated. Hereinafter, for convenience of description, an example where the first table 210 stores four entries will be mainly described. In other words, the row hammer preventing logic 100 may store only four access-requested target row addresses to reduce a row hammer. For example, a first entry may represent that a first row corresponding to an address bit of 0x0010 is accessed 25 times. A second entry may represent that a row corresponding to an address bit of 0x0110 is accessed 33 times. A third entry may represent that a row corresponding to an address bit of 0x1100 is accessed 16 times. A fourth entry may represent that a row corresponding to an address bit of 0x1110 is accessed 11 times.

A command, which requests an access from a target row, may be received at a time T2. The row hammer preventing logic 100 may receive an address bit of 0x1010 and may compare the received address bit with address bits of the entries of the first table 210. The row hammer preventing logic 100 may identify that there is no entry having the same address bit as 0x1010 among the entries of the first table 210, delete the fourth entry of 0x1110, and newly write an address bit of 0x1010 in the first table 210. In other words, when the number of entries managed by the first table 210 is insufficient or small or a storage space of the first table 210 is insufficient or small, count information, representing a target row on which row hammering is to be performed previously and the number of times the target row is accessed, may be deleted. For example, the address bit 0x1110 a number corresponding to how many times it was accessed may be deleted. Therefore, in a case where the row hammer preventing logic 100 of FIG. 3A is used, it may not be recognized that the first table 210 is vulnerable to a row hammering attack due to the insufficiency of a storage space, despite the fact that there is a row actually vulnerable to the row hammering attack.

Figure 3B:
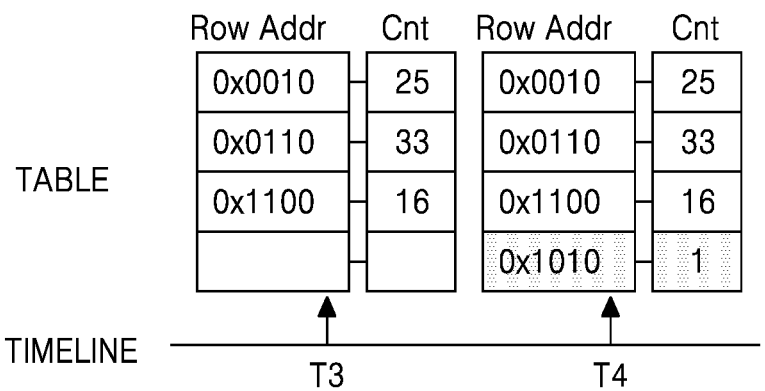
FIG. 3B illustrates a data change of a first table according to an embodiment of the inventive concept.

FIG. 3B illustrates a data change of the first table 210 according to an embodiment of the inventive concept.

Referring to FIG. 3B, entries stored in the first table 210 at a time T3 are illustrated. Hereinafter, for convenience of description, an example where the first table 210 stores four entries is mainly described. The first table 210 may store four entries, but at the time T3, the first table 210 may store three entries. In other words, the first table 210 may be in a state where all of a storage space is not used. For example, a first entry may represent that a first row corresponding to an address bit of 0x000 is accessed 25 times. A second entry may represent that a row corresponding to an address bit of 0x0110 is accessed 33 times. A third entry may represent that a row corresponding to an address bit of 0x1100 is accessed 16 times. A fourth entry may be in a NULL state.

A command, which requests an access from a target row, may be received at a time T4. The row hammer preventing logic 100 may receive an address bit of 0x1010 and compare the received address bit with address bits of the entries of the first table 210. The row hammer preventing logic 100 may identify that there is no entry having the same address bit as 0x1010 among the entries of the first table 210 and may newly write an address bit of 0x1010 in the first table 210. In this case, unlike FIG. 3A, because the fourth entry has an "EMPTY" state among the entries of the first table 210, the row hammer preventing logic 100 may write an address bit of 0x1010 in the fourth entry and may store a counter value as "1". It is to be understood that the fist table 210 may be include more than entries.

FIG. 3C illustrates a data change of a first table 210 according to embodiments of the inventive concept.

Referring to FIG. 3C, entries stored in the first table 210 at a time T5 are illustrated. Hereinafter, for convenience of description, an example where the first table 210 stores four entries will be mainly described. The first table 210 may store four entries, but at the time T5, the first table 210 may store three entries. In other words, the first table 210 may be in a state where all of a storage space is not used. For example, a first entry may represent that a first row corresponding to an address bit of 0x000 is accessed 25 times. A second entry may represent that a row corresponding to an address bit of 0x0110 is accessed 33 times. A third entry may represent that a row corresponding to an address bit of 0x1100 is accessed 16 times. A fourth entry may be in a NULL state.

A command, which requests an access from a target row, may be received at a time T6. The row hammer preventing logic 100 may receive an address bit of 0x1010 and compare the received address bit with address bits of the entries of the first table 210. According to various embodiments, the row hammer preventing logic 100 may compare the received address bit with address bits of the entries of the first table 210 on the basis of bit masking. The bit masking may denote that bits other than a most significant bit (MSB) among address bits are compared. The row hammer preventing logic 100 may search the first table 210 to determine whether there is an entry having the same address bit as 0xX010 which is excepting the MSB among the entries of the first table 210. Referring to FIG. 3C, the row hammer preventing logic 100 may detect that bits other than an MSB among address bits of 0x0010 of the first entry are the same as bits other than an MSB of 0x1010 of a target row. In other words, a row corresponding to an address bit of 0x1010 may be identified as the same row as a row corresponding to an address bit of 0x0010. Therefore, as in FIG. 3B, the row hammer preventing logic 100 may increase, by 1, a count value corresponding to the first entry of 0x0010, instead newly writing 0x0110 in the fourth entry and inputting a count value as "1".

Figure 4:
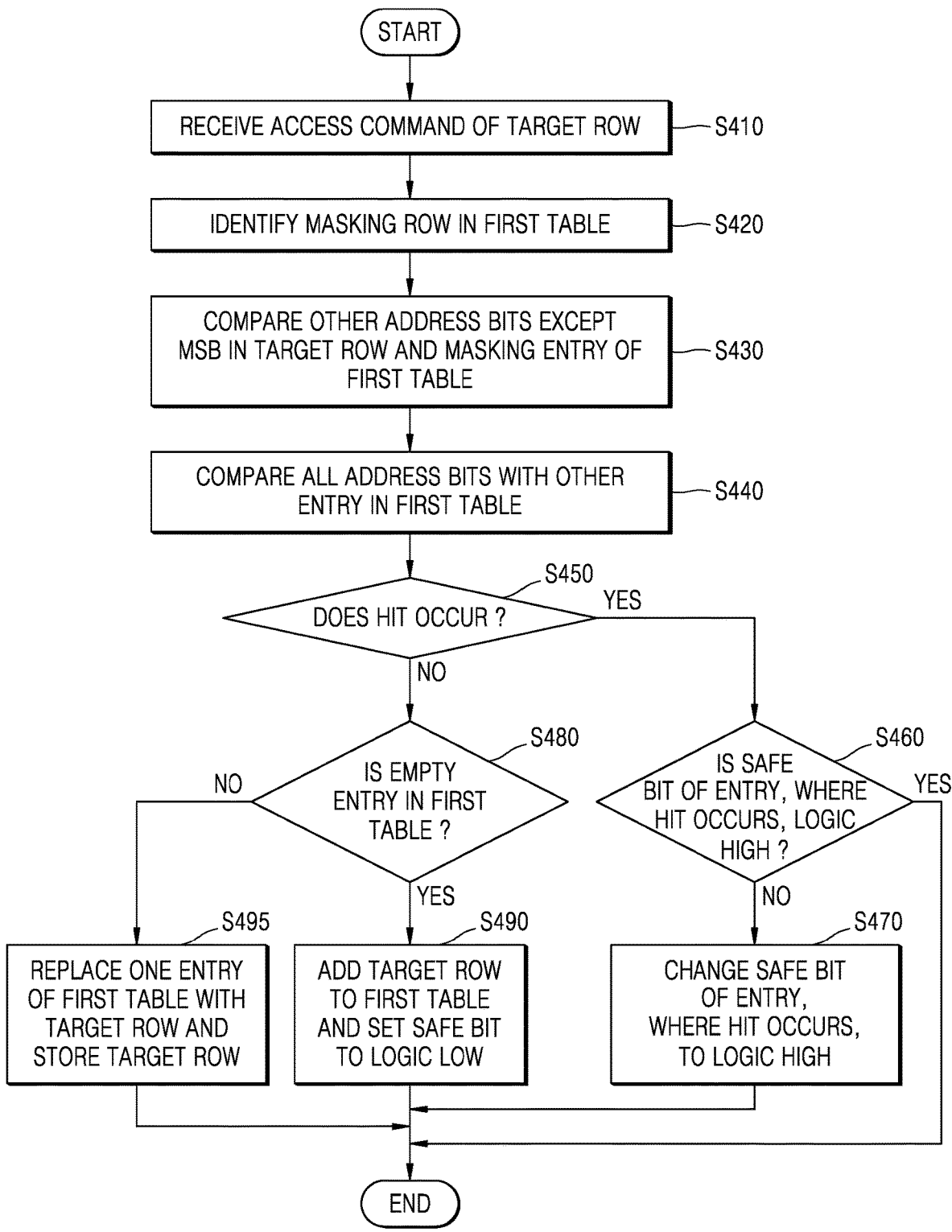
FIG. 4 is a flowchart illustrating an operating method of row hammer preventing circuitry according to embodiments of the inventive concept.

FIG. 4 is a flowchart illustrating an operating method of row hammer preventing circuitry 25 according to embodiments of the inventive concept.

Referring to FIG. 4, in operation S410, the row hammer preventing circuitry 25 may receive an active command of a target row. The target row may denote a row which is to be repeatedly accessed based on row hammering and may be identified by a row address bit received together with an active command.

In operation S420, the row hammer preventing circuitry 25 may identify a masking entry in the first table 210. The first table 210 may be referred to as a table which includes a row address bit of each of a plurality of rows and count information representing a hit counter. For example, the first table 210 may store K number of entries, and each of the K entries may include a row address bit of a previously accessed row and information about a count value representing the total number of previous accesses. According to an embodiment, a plurality of entries stored in the first table 210 may be classified into a masking entry and a normal entry. The masking entry may denote an entry which is determined according to a masking comparison of whether a row address bit of the target row received in operation S410 is the same as a row address bit stored in the entry. The row hammer preventing circuitry 25 may determine positions of entries, where address bits are to be compared based on the masking comparison, of the plurality of entries stored in the first table 210 with reference to a value of a safe bit counter. For example, when K is 8 and a value stored in the safe bit counter 224 is "010", the row hammer preventing circuitry 25 may perform a masking comparison on only a first entry and a second entry of total K entries. As another example, when K is 8 and a value stored in the safe bit counter 224 is "100", the row hammer preventing circuitry 25 may perform a masking comparison on only first to fourth entries of the total K entries.

In operation S430, the row hammer preventing circuitry 25 may compare address bits other than an MSB between a masking entry and a target row in the first table. For example, when the first entry is the masking entry, the row hammer preventing circuitry 25 may compare whether bits other than an MSB among row address bits stored in the first entry are the same as bits other than an MSB among row address bits of the target row. When the bits other than the MSB of the first entry are the same as the bits other than the MSB of the target row, it may be determined that a row of the first entry is the same as the target row.

In operation S440, the row hammer preventing circuitry 25 may compare all address bits between the target row and the other entries of the first table 210. For example, when second to $K^{th}$ entries are normal entries, the row hammer preventing circuitry 25 may normally compare whether all of row address bits stored in each of the second to $K^{th}$ entries are the same as all of row address bits of the target row. In other words, in a case where two rows having only different MSB values are compared (for example, 0x1010 and 0x0010), when based on a masking comparison, the two rows may be recognized as the same rows since '010' is compared to '0100', and when based on a normal comparison, the two rows may be recognized as different rows since '1010' is compared to '0010'.

In operation S450, the row hammer preventing circuitry 25 may determine whether a hit occurs. For example, when the first entry is the masking entry, the row hammer preventing circuitry 25 may compare whether bits other than an MSB among row address bits stored in the first entry are the same as bits other than an MSB among row address bits of the target row. If the compared bits are the same, the row hammer preventing circuitry 25 may determine that hit occurs. As another example, in a case where the second entry is a normal entry, when all of the row address bits of the second entry match all of the row address bits of the target row, the row hammer preventing circuitry 25 may determine that hit occurs.

In operation S460, the row hammer preventing circuitry 25 may determine whether a safe bit of an entry where a hit occurs is logic high. When the safe bit of the entry where the hit occurs is logic high, the row hammer preventing circuitry 25 may end a process because the safe bit has to be changed to logic high due to the occurrence of the hit. In operation S470, when the safe bit of the entry where the hit occurs is logic low, the row hammer preventing circuitry 25 may change the safe bit to logic high.

In operation S480, the row hammer preventing circuitry 25 may determine that an empty entry is in the first table 210. Because a miss occurs in operation S450, the target row transferred in operation S410 may be a row including a new row address bit which is not stored in the first table 210. Therefore, the row hammer preventing circuitry 25 may determine whether a storage space remains and may determine whether to newly write the target row.

In operation S490, the row hammer preventing circuitry 25 may add the target row to the first table 210 and may set a safe bit to logic low. When it is determined in operation S480 that an empty entry is in the first table 210, the row hammer preventing circuitry 25 may not need to delete entries which are previously input, and thus, may write the target row in the empty entry. In addition, because the target row being accessed is the first (miss occurs in operation S450), the row hammer preventing circuitry 25 may set the safe bit to logic low or "0".

In operation S495, the row hammer preventing circuitry 25 may replace one entry of the first table 210 with the target row and may store the target row. When it is determined in operation S480 that an empty entry is not in the first table 210, the row hammer preventing circuitry 25 may replace one of previously input entries with the target row. According to various embodiments, the row hammer preventing circuitry 25 may select an entry which is lately written or may select an entry where a count value representing a hit counter is lowest, but the inventive concept is not limited thereto and various entry selection methods may be used. In addition, because the target row being accessed is the first (miss occurs in operation S450), the row hammer preventing circuitry 25 may set the safe bit to logic low or "0".

Figure 5:
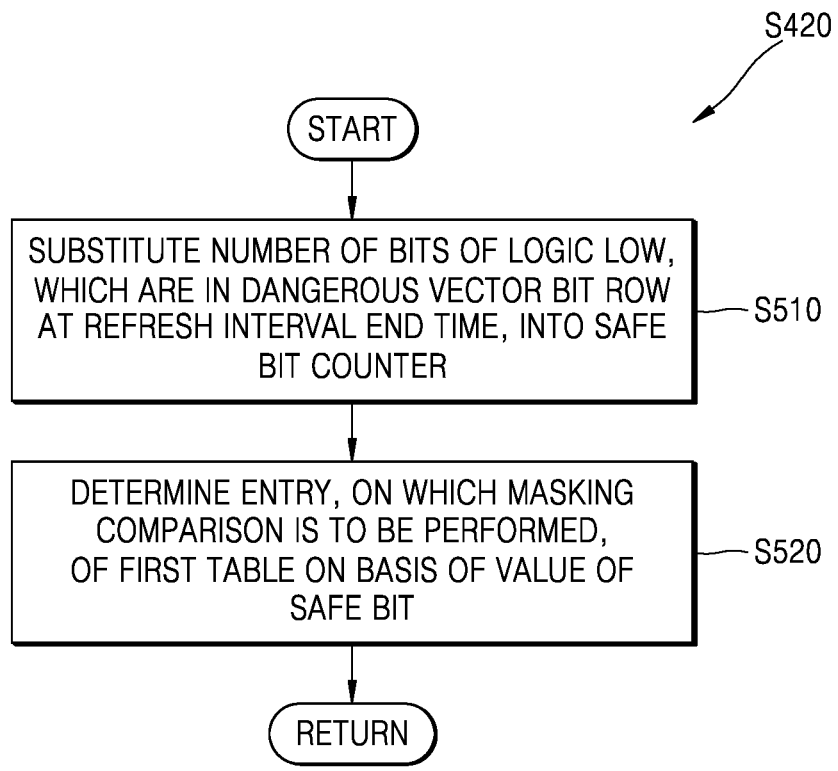
FIG. 5 is a detailed flowchart for identifying a masking entry according to embodiments of the inventive concept.

FIG. 5 is a detailed flowchart for identifying a masking entry according to embodiments of the inventive concept.

Referring to FIG. 5, in operation S510, the row hammer preventing circuit 25 may substitute the number of bits of "0" or logic low, which are in the dangerous vector bit row 222 at a refresh interval end time, into the safe bit counter 224. A bit of "0" or logic low in the dangerous vector bit row 222 may represent that a certain entry has been frequently replaced. That entries stored in the first table 210 have been frequently replaced may denote that a storage capacity of the first table 210 is not large to the degree to which all of target rows to be attacked by a row hammer are stored. Therefore, the row hammer preventing circuitry 25 may increase the number of entries on which a masking comparison is performed, to compensate for an insufficient entry of the first table 210. The row hammer preventing circuitry 25 may substitute the number of bits of "0" or logic low, which are in the dangerous vector bit row 222 at the refresh interval end time, into the safe bit counter 224, and thus, may variably set the number of entries on which a masking comparison is to be performed in a next refresh interval.

In operation S520, the row hammer preventing circuitry 25 may determine an entry, on which a masking comparison is to be performed, of the first table 210 on the basis of a value of the safe bit counter 224. The row hammer preventing circuitry 25 may perform a masking comparison up to a decimal integer-numbered entry represented by a value of the safe bit counter 224 among the K entries. For example, when a value stored in the safe bit counter 224 is "010", the row hammer preventing circuitry 25 may perform a masking comparison on only a first entry and a second entry of total K entries. As another example, when the value stored in the safe bit counter 224 is "100", the row hammer preventing circuitry 25 may perform a masking comparison on only first to fourth entries of the total K entries.

Figure 6:
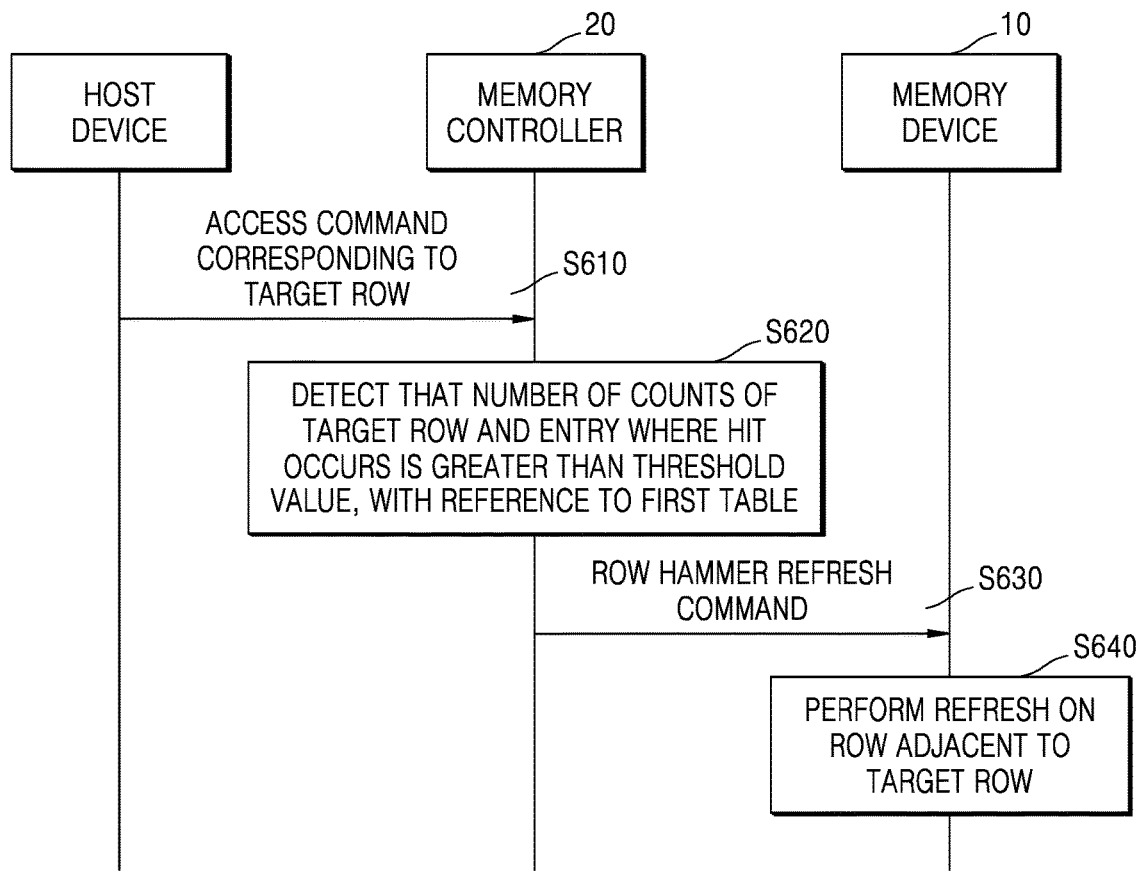
FIG. 6 illustrates a signal exchange diagram of a memory system according to embodiments of the inventive concept.

FIG. 6 illustrates a signal exchange diagram of a memory system according to embodiments of the inventive concept.

Referring to FIG. 6, in operation S610, the host device HOST may transfer an access command corresponding to a target row to the memory controller 20. In operation S620, the memory controller 20 may detect that the number of counts of a target row and an entry where a hit occurs is greater than a threshold value, with reference to the first table 210.

According to an embodiment, the target row and the entry where the hit occurs may correspond to a masking entry. For example, in a case where K is 8 and a safe bit counter value is "111", when the target row matches address bits other than an MSB of each of entries stored in the first table 210, the row hammer preventing circuitry 25 may determine that the target row is the same row and may increase a count value of the entry where the hit occurs.

According to other embodiments, the target row and the entry where the hit occurs may correspond to a normal entry. For example, in a case where K is 8 and a safe bit counter value is "000", when the target row matches all of the address bits of the entries stored in the first table 210, the row hammer preventing circuitry 25 may determine that the target row is the same row and may increase the count value of the entry where the hit occurs.

In operation S630, the memory controller 20 may transfer a row hammer refresh command to the memory device 10. According to an embodiment, when an entry where the number of counts is greater than a threshold value is a normal entry, the memory controller 20 may generate the row hammer refresh command indicating the additional refreshing of rows adjacent to a row corresponding to the normal entry. For example, when a row address bit stored in the normal entry is 0x0010, the memory controller 20 may perform control to additionally refresh two rows adjacent to a row of 0x0010. According to another embodiment, when the entry where the number of counts is greater than the threshold value is a masking entry, the memory controller 20 may generate the row hammer refresh command indicating the additional refreshing of rows respectively adjacent to rows corresponding to the masking entry. For example, when a row address bit stored in the masking entry is 0x0010, the memory controller 20 may perform control to additionally refresh two rows adjacent to a row of 0x000 and two rows adjacent to a row of 0x1010. This is because a row of 0x0010 and a row of 0x1010 are identified as the same row in the masking entry. In operation S640, the memory device 10 may receive the row hammer refresh command and may additionally refresh adjacent rows which are a target of a command.

Figure 7:
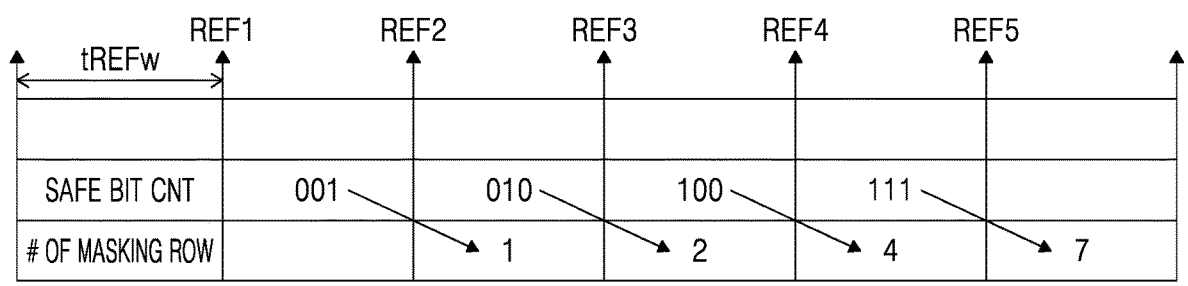
FIG. 7 illustrates the number of masking entries for each refresh interval, according to embodiments of the inventive concept.

FIG. 7 illustrates the number of masking entries for each refresh interval, according to embodiments of the inventive concept.

Referring to FIG. 7, a first interval may correspond to a first refresh time REF1 and a second refresh time REF2. Hereinafter, for convenience of description, an example will be mainly described where the number of entries is K, K is 8, and the safe bit counter 224 includes eight registers for storing $\log_2 K$ number of bits (e.g., 3 bits), but the inventive concept is not limited thereto. During the first interval, a value of the safe bit counter 224 may be "001". During the first interval, the number of bits of "0" or logic low in the dangerous vector bit row 222 may be 1. In other words, during the first interval, the number of entries, which are replaced with an address bit of a new target row because a miss occurs, of entries stored in the first table 210 may be 1. In the row entries to which a row hammering attack is to be applied, a hit may occur in the entries stored in the first table 210, and thus, the row hammer preventing circuitry 25 may set the number of masking entries to 1.

A second interval may correspond to the second refresh time REF2 and a third refresh time REF3. During the second interval, a value of the safe bit counter 224 may be "010". In other words, during the second interval, the number of entries, which are replaced with an address bit of a new target row because a miss occurs, of entries stored in the first table 210 may be 2. A miss, which is not included in the entries stored in the first table 210 in the row entries to which the row hammering attack is to be applied, may increase, and thus, the row hammer preventing circuitry 25 may increase, by 2, the number of masking entries to increase a hit probability.

A third interval may correspond to the third refresh time REF3 and a fourth refresh time REF4. During the third interval, a value of the safe bit counter 224 may be "100". In other words, during the third interval, the number of entries, which are replaced with an address bit of a new target row because a miss occurs, of the entries stored in the first table 210 may be 4. A miss, which is not included in the entries stored in the first table 210 in the row entries to which the row hammering attack is to be applied, may increase, and thus, the row hammer preventing circuitry 25 may increase, by 4, the number of masking entries to further increase a hit probability than the first interval and the second interval.

A fourth interval may correspond to the fourth refresh time REF4 and a fifth refresh time REF5. During the fourth interval, a value of the safe bit counter 224 may be "111". In other words, during the fourth interval, the number of entries, which are replaced with an address bit of a new target row because a miss occurs, of the entries stored in the first table 210 may be 7. In other words, because a storage capacity of the first table 210 is limited, information about a target row to which the row hammering attack is applied may not be additionally stored, and most of the entries of the first table 210 may be changed. A miss, which is not included in the entries stored in the first table 210, may increase, and thus, the row hammer preventing circuitry 25 may increase, by 7, the number of masking entries to increase a hit probability. When the number of masking entries is 7, the first table 210 may perform a row hammer preventing operation on two times the amount of rows by using the same storage capacity.

While the inventive concept has been particularly shown and described with reference to embodiments thereof, it will be understood that various changes in form and details may be made thereto without departing from the spirit and scope of the inventive concept as set forth in the following claims.

What is claimed is:

1. A row hammer preventing circuitry, comprising:
a first table configured to store a count value representing a hit count and an address bit of each of a plurality of entries, each of the entries corresponding to access-requested target rows;
a second table including safe bits representing whether each of the plurality of entries is accessed twice or more and a safe bit counter representing the number of the safe bits having a logic low; and
a row hammer preventing logic configured to identify masking entries, on which a masking comparison is to be performed, among the plurality of entries stored in the first table on the basis of a value of the safe bit counter, to determine a hit or a miss on the basis of whether other bits except a most significant bit among address bits of an access-requested target row match other bits except a most significant bit among address bits of the masking entries, and to generate a first control signal indicating an additional refresh is to be performed on rows adjacent to rows corresponding to a masking entry whose hit count is greater than a first threshold value.

2. The row hammer preventing circuitry of claim 1, wherein the row hammer preventing logic is configured to determine the hit or miss on the basis of whether all bits of address bits of normal entries except the masking entries among the plurality of entries match all bits of the address bits of the access-requested target row.

3. The row hammer preventing circuitry of claim 2, wherein the row hammer preventing logic is configured to, when a hit count among the normal entries is greater than a second threshold value, generate a second control signal indicating an additional refresh is to be performed on rows adjacent to a row corresponding to a normal entry of which hit count is greater than the second threshold value.

4. The row hammer preventing circuitry of claim 1, wherein the number of safe bits is the same as the number of entries of the first table.

5. The row hammer preventing circuitry of claim 1, wherein the masking entries are sequentially selected from among the plurality of entries on the basis of the same number as a safe bit counter value.

6. The row hammer preventing circuitry of claim 1, wherein a masking entry which is greater than the first threshold value comprises a first row and a second row, where the most significant bit differs and other address bits are the same.

7. The row hammer preventing circuitry of claim 6, wherein the row hammer preventing logic is configured to generate a third control signal indicating an additional refresh is to be performed on the first row and the second row in response to a repeated access to the first row.

8. A memory device, comprising:
a memory cell array including a plurality of memory cells; and
a memory controller including a table, which includes a count value representing a hit count and address bits of a plurality of entries, a safe bit representing whether each of a plurality of target rows is accessed twice or more during a refresh interval, and a safe bit counter representing the number of the safe bits having a logic low; and a row hammer preventing circuitry configured to identify masking entries, on which a masking comparison is to be performed, among a plurality of entries stored in the table on the basis of a value of the safe bit counter and to determine a hit or a miss on the basis of whether other bits except a most significant bit among address bits of an access-requested target row match other bits except a most significant bit among address bits of the masking entries.

9. The memory device of claim 8, wherein the row hammer preventing circuitry is configured to, when a hit count among the masking entries is greater than a threshold value, indicate an additional refresh is to be performed on rows adjacent to rows corresponding to a masking entry which is greater than the threshold value.

10. The memory device of claim 9, wherein the row hammer preventing circuitry is configured to determine the hit or the miss on the basis of whether all bits of address bits of normal entries except the masking entries among the plurality of entries match all bits of address bits of the access-requested target row and to indicate an additional refresh is to be performed on rows adjacent to a row corresponding to a normal entry whose hit count is greater than a threshold value.

11. The memory device of claim 10, wherein the row hammer preventing circuitry is configured to, when all address bits of the normal entries do not match all address bits of the access-requested target row, determine the occurrence of the miss, to determine whether there is an entry including no address bit among the plurality of entries, and to write an address bit of the access-requested target row in an entry including no address bit.

12. The memory device of claim 11, wherein the row hammer preventing circuitry is configured to, when each of the plurality of entries includes an address bit, write the address bit of the access-requested target row in an entry having a lowest count value among the plurality of entries.

13. The memory device of claim 8, wherein the number of safe bits is the same as the number of entries in the table.

14. The memory device of claim 8, wherein the masking entries are sequentially selected from among the plurality of entries on the basis of the same number as a safe bit counter value.

15. The memory device of claim 9, wherein a masking entry of which hit count is greater than the threshold value comprises a first row and a second row, where the most significant bit differs and other address bits are the same.

16. The memory device of claim 15, wherein the row hammer preventing logic is configured to generate a control signal indicating an additional refresh operation is to be performed on the first row and the second row in response to a repeated access to the first row.

17. An operating method of a memory device, the operating method comprising:

receiving an access command corresponding to a target row;

identifying a masking entry among a plurality of entries corresponding to access-requested rows;

performing a first comparison in which it is determined whether other bits except a most significant bit in address bits of the masking entry matches other bits except a most significant bit in address bits of the target row;

when a hit occurs as a result of the first comparison, increasing a hit count of a masking entry corresponding to the hit; and when the hit count is greater than a first threshold value, generating a control signal indicating an additional refresh is to be performed on rows respectively adjacent to two rows corresponding to the masking entry.

18. The operating method of claim 17, wherein the identifying of the masking entry comprises:

identifying the number of safe bits having a logic low, wherein the safe bits represent whether each of the plurality of entries is accessed twice or more; and determining, as the masking entry, an entry including an identified number of safe bits among the plurality of entries.

19. The operating method of claim 17, further comprising:

performing a second comparison in which it is determined whether all bits of address bits of a normal entry except the masking entry among the plurality of entries match all bits of address bits of the target row;

when a hit occurs in the second comparison, increasing a hit count of a normal entry corresponding to the hit; and when the hit count is greater than a second threshold value, generating a control signal indicating an additional refresh is to be performed on rows adjacent to a row corresponding to the normal entry.

20. The operating method of claim 17, wherein the generating of the control signal indicating the additional refresh is to be performed on the rows respectively adjacent to the two rows corresponding to the masking entry comprises performing a refresh on rows respectively adjacent to a first row and a second row, where other address bits except a most significant bit are the same.

* * * * *